(12) United States Patent
Hong et al.

(10) Patent No.: US 6,190,233 B1
(45) Date of Patent: Feb. 20, 2001

(54) METHOD AND APPARATUS FOR IMPROVING GAP-FILL CAPABILITY USING CHEMICAL AND PHYSICAL ETCHBACKS

(75) Inventors: Soonil Hong, Los Altos; Choon Kun Ryu, Sunnyvale; Michael P. Nault, San Jose; Kaushal K. Singh, Sunnyvale; Anthony Lam, San Jose; Virendra V. S. Rana; Andrew Conners, both of Los Gatos, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/025,965

(22) Filed: Feb. 19, 1998

Related U.S. Application Data

(63) Continuation-in-part of application No. 08/803,304, filed on Feb. 20, 1997.

(51) Int. Cl.[7] .................................................. B24C 3/22
(52) U.S. Cl. ................................. 451/2; 451/65; 437/228
(58) Field of Search ............................. 451/65, 38, 39, 451/5, 2; 437/228, 235, 238

(56) References Cited

U.S. PATENT DOCUMENTS

| | | | |
|---|---|---|---|
| 4,732,658 | 3/1988 | Lee | 437/228 |
| 5,013,400 | 5/1991 | Kurasaki et al. | 156/643 |
| 5,204,288 | 4/1993 | Marks et al. | 437/228 |
| 5,270,264 | 12/1993 | Andideh et al. | 437/228 |
| 5,296,092 | 3/1994 | Kim | 156/643 |
| 5,354,715 | 10/1994 | Wang et al. | 437/238 |
| 5,514,624 | 5/1996 | Morozumi | 437/195 |
| 5,575,886 | 11/1996 | Murase | 156/636.1 |
| 5,698,467 | 12/1997 | Sakao et al. | 437/195 |
| 5,721,172 | 2/1998 | Jang et al. | 438/424 |
| 5,841,196 | 11/1998 | Gupta et al. | 257/774 |

FOREIGN PATENT DOCUMENTS

| | | |
|---|---|---|
| 0423907A | 4/1991 | (EP) . |
| 0478174A | 4/1992 | (EP) . |

OTHER PUBLICATIONS

Mizuno S et al: "Improved Gap–Filling Capability Of Fluorine–doped PECVD Silicon Oxide Thin films" Thin solid films, vol. 279, No. ½, Jun. 1, 1996, pp. 82–86.

Davari B et al: "A New Planarization Technique, Using A combination Of RIE and Chemical Mechanical Polish-(CMP" Proceedings of the International Electron Devices Meeting, Washington, Dec. 3–6, 1989, Dec. 3, 1989, pp 61–64, IEEE.

*Primary Examiner*—Robert A. Rose
(74) *Attorney, Agent, or Firm*—Townsend & Townsend & Crew

(57) ABSTRACT

A method and an apparatus for depositing a dielectric layer to fill in a gap between adjacent metal lines. In preferred embodiments of the method, a first dielectric layer is deposited over the lines and subsequently etched using both chemical and physical etchback steps. After the etchback steps are completed, a second dielectric layer is deposited over the first dielectric layer to fill in the gap.

11 Claims, 12 Drawing Sheets

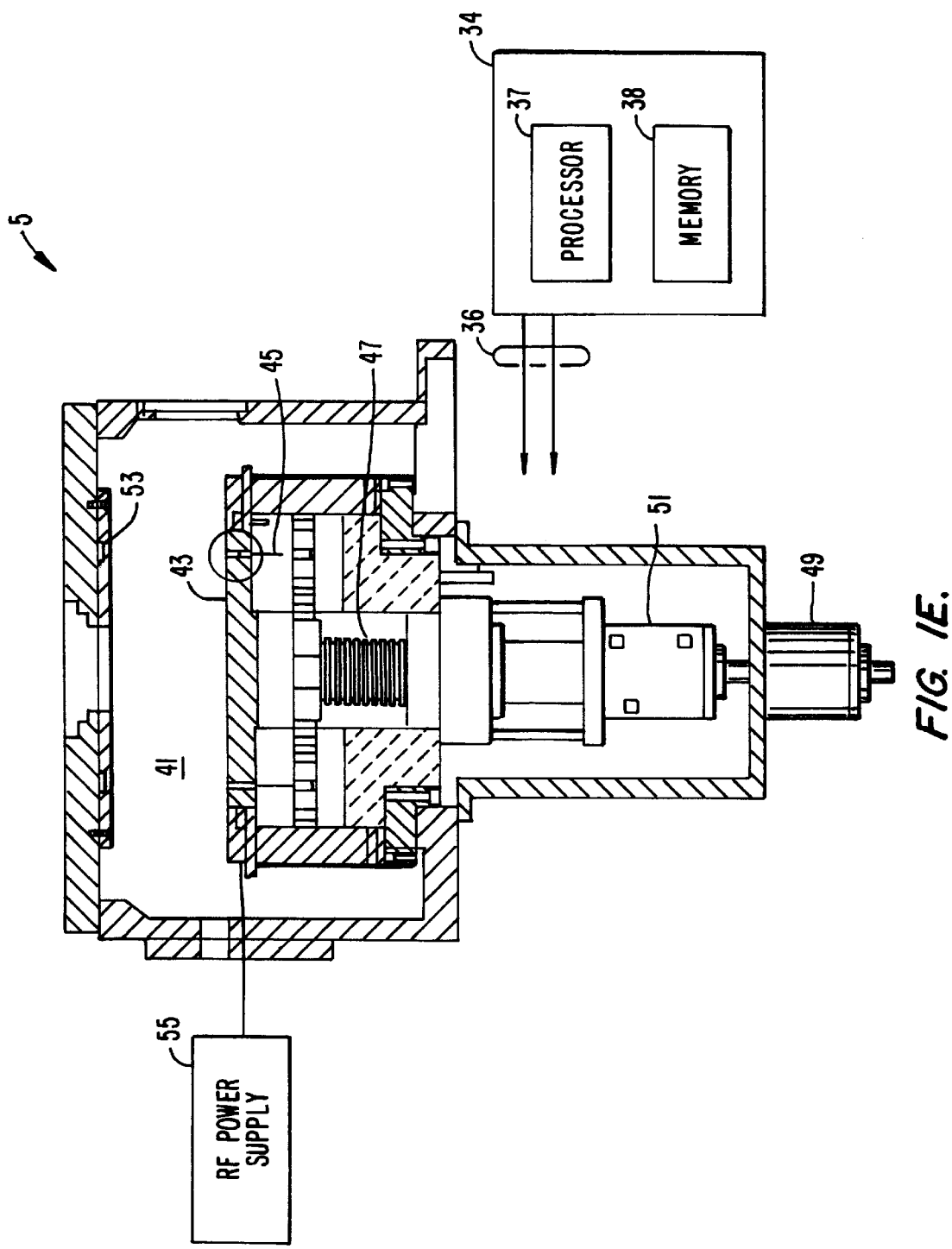

IMD (0.45 μm WIDTH × 0.9 μm HEIGHT)

PASSIVATION (0.8 μm WIDTH × 1.3 μm HEIGHT)

METHOD AND APPARATUS FOR IMPROVING GAP-FILL CAPABILITY USING CHEMICAL AND PHYSICAL ETCHBACKS

CROSS-REFERENCE TO RELATED APPLICATIONS

This application is a continuation-in-part of U.S. Ser. No. 08/803,304, entitled "METHOD AND APPARATUS FOR IMPROVING GAP-FILL CAPABILITY USING CHEMICAL AND PHYSICAL ETCHBACKS" filed Feb. 20, 1997, and having Soonil Hong, Choon Kun Ryu, Michael P. Nault, Kaushal K. Singh, Anthony Lam, Virendra V. S. Rana and Andrew Conners listed as co-inventors.

BACKGROUND OF THE INVENTION

The present invention relates to the deposition of dielectric layers during wafer processing, and more specifically to a method and apparatus for performing chemical and physical etchback processes to further improve gap-fill capability.

Interconnections on semiconductor devices are typically made by metal conductors, which in some cases are narrow, closely spaced metal lines. The use of two or more levels of metal conductors requires the deposition of an insulating layer between the layers of metal to avoid a short circuit between conductors or other anomalies.

Thus, one of the primary steps in the fabrication of modern multilevel semiconductor devices is the formation of these insulating layers, which are also referred to as intermetal dielectric layers, or IMD layers. One of the primary methods of forming IMD layers on a semiconductor substrate is by chemical reaction of gases. Such a deposition process is referred to as chemical vapor deposition or "CVD." Conventional thermal CVD processes supply reactive gases to the substrate surface where heat-induced chemical reactions produce a desired film. Another CVD method of depositing layers includes plasma-enhanced CVD (PECVD) techniques. Plasma CVD techniques promote excitation and/or dissociation of the reactant gases by the application of energy, such as radio frequency (RF) energy, to excite the reactant gases, thereby creating a plasma. The high reactivity of the species in the plasma reduces the energy required for a chemical reaction to take place, and thus lowers the required temperature for such CVD processes. The relatively low temperature of a PECVD process makes such processes ideal for the formation of insulating layers over deposited metal layers and for the formation of other insulating layers.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's wafer fabrication plants are routinely producing devices with 0.5 $\mu$m and even 0.35 $\mu$m features, and tomorrow's plants soon will be producing devices with even smaller geometries.

As device sizes become smaller and integration density increases, issues that were not previously considered important by the industry are becoming of paramount concern. For example, as circuit densities increase, the spacing between adjacent metal conductors decreases, which causes an increase in the ratio of the height of adjacent conductors to their separation, commonly referred to as the aspect ratio. An increase in the aspect ratio is accompanied by an increase in the likelihood that a deposited insulating layer will not conform to and completely fill the gap between conductors. Thus, as an insulating layer is deposited, an undesirable void may form within the layer between adjacent conductors. Typically, voids are formed when the dielectric deposits on the upper portion of adjacent metal vertical side walls contact each other before the bottom of the gap is filled.

One solution to this problem is to deposit fluorine-doped silicon oxide films, which are also referred to as fluorosilicate glass (FSG) films. Because fluorine is an etching species, it is believed that fluorine doping introduces an etching effect on the growing film. This simultaneous deposition/etching effect slows the deposition on the top of the sidewalls thereby allowing that the bottom of the gap to fill before the top closes.

Another solution to the gap-fill problem is to perform a three-step deposition/etchback/deposition process. In this three-step process, an insulating layer is first partially deposited over a metal layer. Next, a physical etchback step is performed in which the deposited insulation layer is bombarded with argon or a similar gas in a sputtering step. The argon sputtering etches away some of the excess deposits that might otherwise contribute to void formation. After completion of the physical etchback, deposition is completed in the third step.

The three-step deposition/etchback/deposition process provides improved gap-fill capabilities that are suitable for many applications. However, as devices become even smaller, better gap-fill capabilities are desirable for some applications. Hence, there is a need for a method and an apparatus that further improve the gap-fill capability of present dielectric films.

SUMMARY OF THE INVENTION

The present invention provides an insulating layer with improved gap-fill capabilities. Improved gap-fill is obtained by using both chemical and physical etchback steps after deposition of a first portion of the insulating layer. The present invention also includes a method and apparatus for fabricating such a layer.

According to the method of the present invention, a first layer of dielectric material is deposited over a substrate in a processing chamber. The layer is then etched back using a two-step etch process that includes both chemical and physical etchback steps. After the two-step etchback process in completed, a second layer of dielectric material is deposited over the substrate to complete the gap-fill process.

In one embodiment, the two-step etchback process includes a first, chemical etchback step followed by a physical etchback step. In another embodiment of the method of the present invention, the first dielectric layer is etched back using a physical etchback, followed by a chemical etchback. In still yet another embodiment, the first dielectric layer is etched back using more than two alternating chemical and physical etchback steps.

In another preferred embodiment, the first and second dielectric layers are FSG layers, and in a most preferred embodiment these layers are deposited from a process gas that includes silicon provided by tetraethylorthosilicate (TEOS) and fluorine provided by triethoxyfluorosilane (TEFS). Carbon tetrafluoride ($CF_4$) is employed as an etchant gas during the chemical etchback step and argon is employed as a sputtering element during the physical etchback step.

These and other embodiments of the present invention, along with many of its advantages and features, are described in more detail in the text below and the attached figures.

BRIEF DESCRIPTION OF THE DRAWINGS

FIG. 1E is a cross-sectional view of one embodiment of a simplified etchback chamber;

DETAILED DESCRIPTION OF THE PREFERRED EMBODIMENTS

I. Exemplary CVD System

Figure 1A:
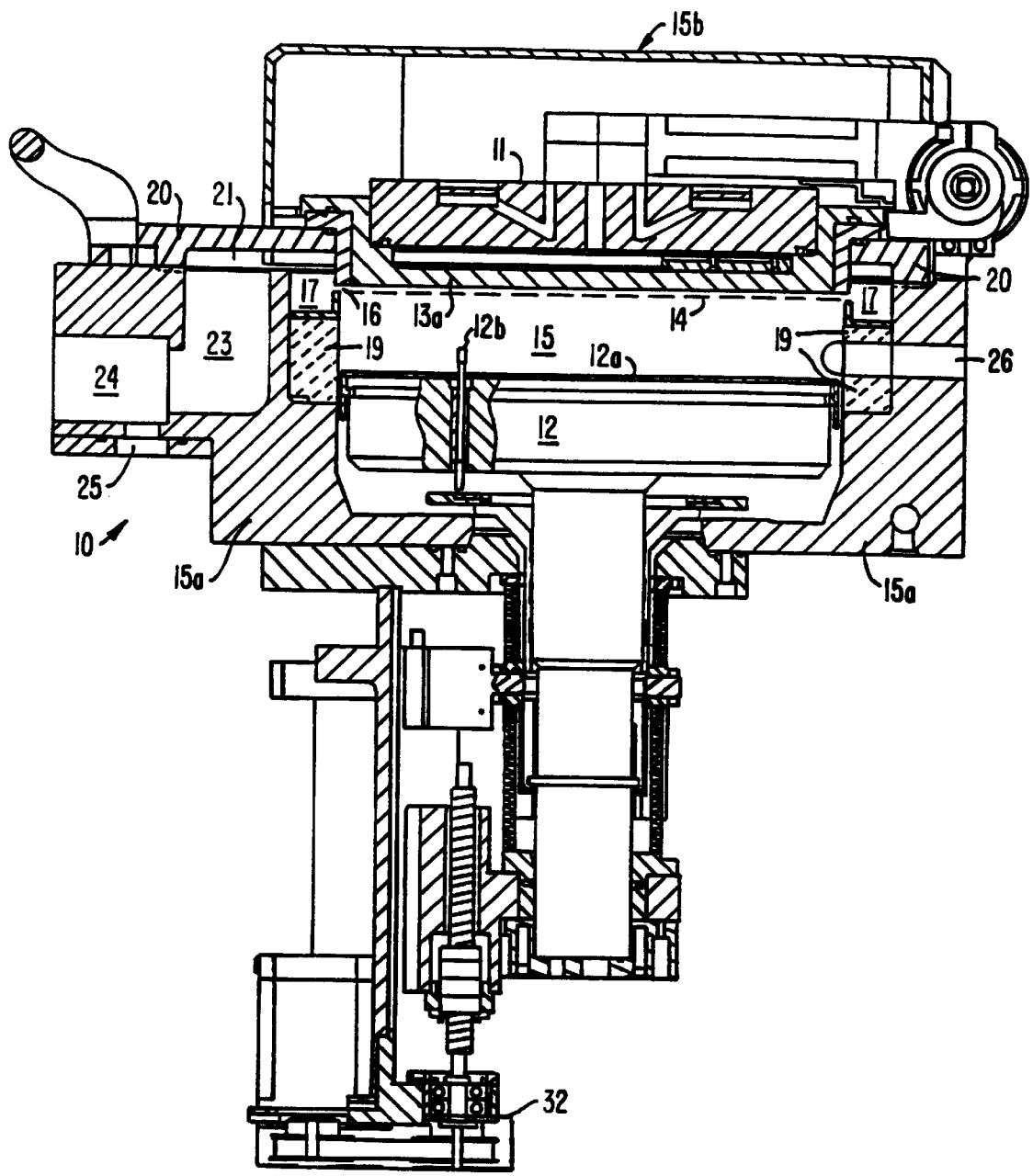
FIGS. 1A and 1B are vertical, cross-sectional views of one embodiment of a CVD apparatus according to the present invention.
Figure 1B:
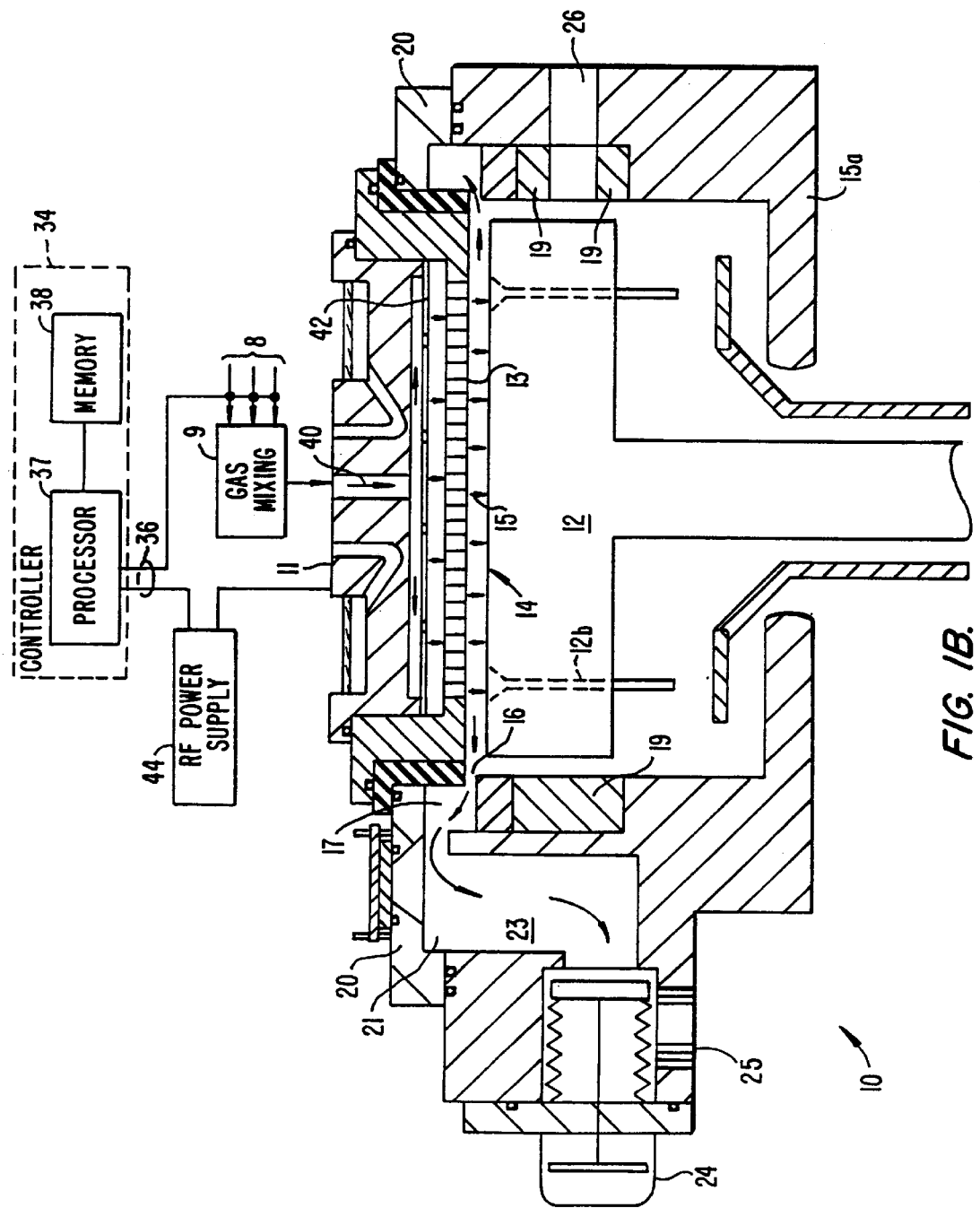
Figure 1C:
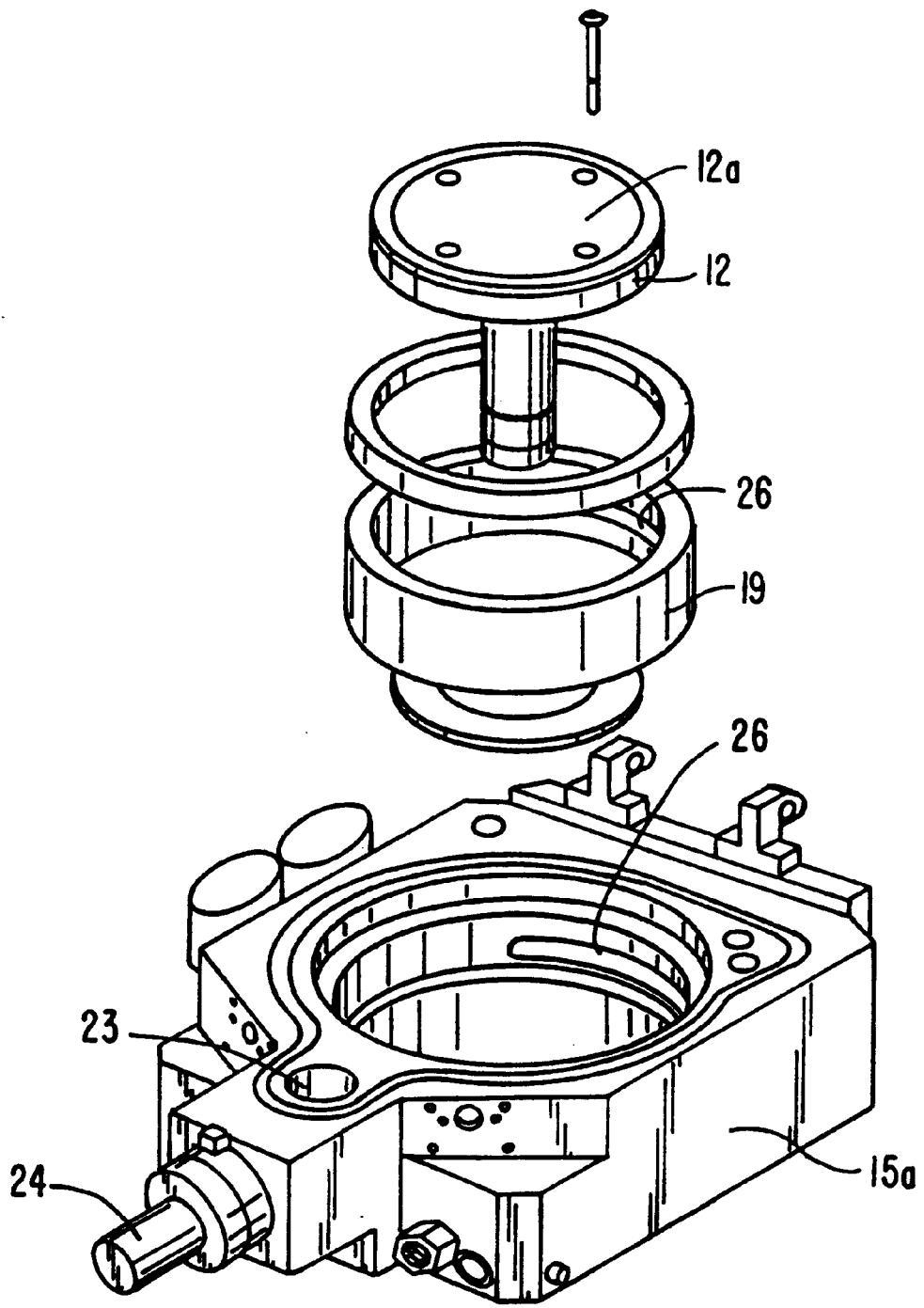
FIGS. 1C and 1D are exploded perspective views of parts of the CVD chamber depicted in FIG. 1A.
Figure 1D:
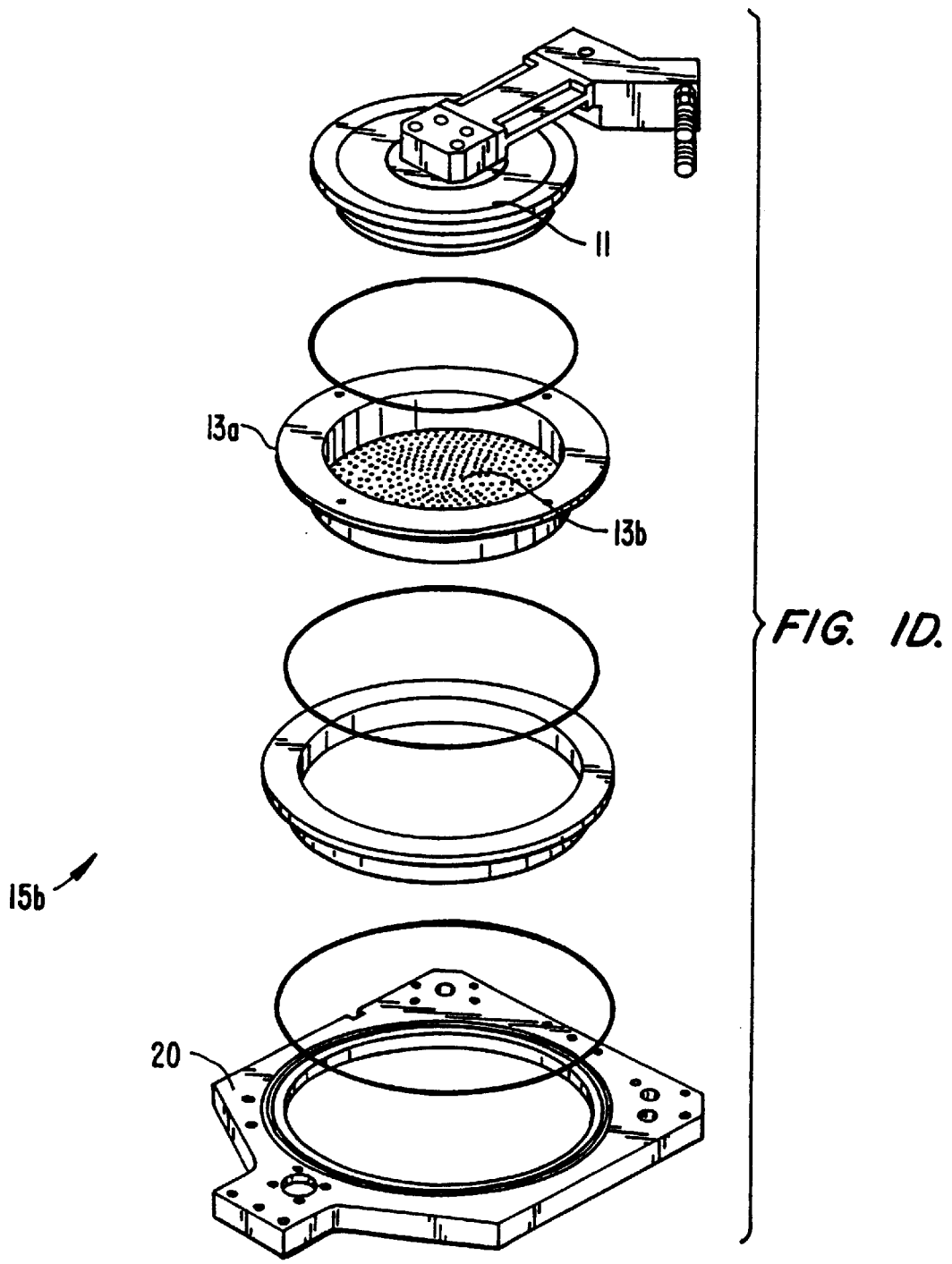

One suitable CVD apparatus in which the method of the present invention can be carried out is shown in FIGS. 1A and 1B, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

System 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are introduced into chamber 15 through perforated holes 13b (FIG. 1D) of a conventional flat, circular gas distribution face plate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold, deposition and carrier gases are input through gas supply lines 8 into a mixing system 9 where they are combined and then sent to manifold 11. Generally, the supply line for each process gas includes (i) several safety shut-off valves (not shown) that can be used to automatically or manually shut off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma-enhanced process. In a plasma-enhanced process, a radio frequency (RF) power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed-frequency RF power supply that typically supplies power at a high RF frequency (RF1) of 13.56 MHz and at a low RF frequency (RF2) of 360 KHz to enhance the decomposition of reactive species introduced into vacuum processing chamber 15.

During a deposition process, the plasma heats the entire process chamber 10, including the walls of the chamber body 15a surrounding the exhaust passageway 23 and the shut-off valve 24. When the plasma is not turned on, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum) is heated using an embedded, single-loop heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware is made out of material such as aluminum or anodized aluminum. An example of such a CVD apparatus is described in a U.S. Pat. No. 5,558,717 entitled "CVD Processing Chamber," issued to Zhao et al. The 5,558,717 patent is assigned to Applied Materials, Inc., the assignee of the present invention, and is hereby incorporated by reference in its entirety.

A lift mechanism and motor 32 (FIG. 1A) raises and lowers the heater pedestal assembly 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a processing position 14 and a lower, wafer-loading position. The motor, valves or flow controllers 20 connected to supply lines 8, gas delivery system, throttle valve 32, RF power supply 44, and chamber and substrate heating systems are all controlled by a system controller 34 (FIG. 1B) over control lines 36 of which only some are shown. Controller 34 relies on feedback from optical sensors to determine the position of movable mechanical assemblies such as the throttle valve and pedestal, which are moved by appropriate motors under the control of controller 34.

The above description is mainly for illustrative purposes only and should not be considered as limiting the scope. Other CVD equipment such as electron cyclotron resonance (ECR) plasma CVD devices, induction-coupled RF high-density plasma CVD devices, or the like may be employed. Additionally, variations of the above described system such as variations in pedestal design, heater design, RF power frequencies, location of RF power connections and others are possible. For example, the wafer could be supported and heated by a quartz lamps. The layer and method for forming such a layer of the present invention is not limited to any specific apparatus or to any specific plasma excitation method.

II. Exemplary Etchback System

In a currently preferred embodiment of the present invention, the substrate is moved under vacuum seal from processing chamber 15 to etchback chamber 41 for the chemical and physical etchback processes. It is possible in other embodiments, however, to carry out both the deposition and etchback steps in a single substrate processing chamber as an in-situ process.

FIG. 1E shows a cross-sectional view of one embodiment of a simplified etchback system 5 that includes an etchback chamber 41 in which the chemical and physical etchback steps according to the present invention may be carried out. As shown in FIG. 1E, pedestal 43 supports a substrate as the substrate undergoes chemical and physical etchback in etchback chamber 41. Lift finger 45 raises and lowers the wafer to and from the pedestal surface. Bellows 47 transfers motion from a lift cylinder 49 to lift finger 45 while maintaining the vacuum integrity of the chamber. Bellows 47 moves upward by pneumatic expansion of lift cylinder 49. A return spring in a lift actuator 51 causes downward movement. Lift cylinder 49 pneumatically drives bellows 47 and moves lift finger 45 to three possible positions: Etchback, Release or Lift. Three sensors and one flag define position reference points. The position sensors are on adjustable slide mounts. Lift actuator 51 lowers lift finger 45 with a return spring and transfers upward motion of lift cylinder 49 to bellows 47.

Etchback chamber 41 encloses the etchback processing environment since both the chemical and physical etchbacks may be performed in chamber 41. In the physical etchback process, sputtering may be achieved by the introduction of an inert gas into etchback chamber 41. The inert gas may be introduced through a gas distribution plate 53, while a throttle valve controls the pumping rate until the desirable pressure is reached (typically 1 mTorr to 700 mTorr). RF power is supplied from RF power supply 55 to pedestal 43, upon which the wafer is positioned. The RF power accelerates electrons back and forth, causing ionization of the gas molecules and forming a plasma state. In addition, the RF power induces a negative self bias voltage on the wafer due to the higher mobility of the negative charged electrons in the plasma. The negative voltage attracts and accelerates ions, so that the ions collide with the surface of the wafer, causing sputtering of the atoms from the surface of the wafer. The wafer is thus physically etched by the sputter removal of surface atoms.

In a chemical etchback process, the plasma is generated in a similar method as the physical etchback, however, the etchback is chiefly accomplished through the use of chemicals such as $CF_4$. The chemical molecules are broken up by the plasma into highly reactive radicals that react with the dielectric layer to form volatile compounds that are pumped away. In addition, the substrate may also be slightly biased so that as the radicals react with the dielectric layer, the reaction occurs in the direction of the bias potential. Controller 34 controls the various elements of and operation of etchback chamber 41 over control lines 36 in a manner similar to the manner in which chamber 15 is controlled.

The above description is mainly for illustrative purposes only and should not be considered as limiting the scope. Variations of the above described system such as variations in pedestal design, heater design, and others are possible. The present invention is not limited to any specific etching apparatus or method.

III. Computer Control of the Processing Systems

In one specific embodiment, a common system controller 34 controls all of the activities of both the CVD system 10 and the etchback system 5, although those skilled in the art will recognize that individual system controllers may be used; one for CVD system 10 and one for etchback system 5.

In a preferred embodiment, the system controller includes a hard disk drive (memory 38), a floppy disk drive and a processor 37. The processor contains a single board computer (SBC), analog and digital input/output boards, interface boards and stepper motor controller boards. Various parts of CVD system 10 conform to the Versa Modular European (VME) standard that defines board, card cage, and connector dimensions and types. The VME standard also defines the bus structure as having a 16-bit data bus and a 24-bit address bus.

System controller 34 controls all of the activities of the CVD and etchback systems. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Of course, other computer programs, such as one stored on another memory device including, for example, a floppy disk or other another appropriate drive, may also be used to operate controller 34.

Figure 1F:
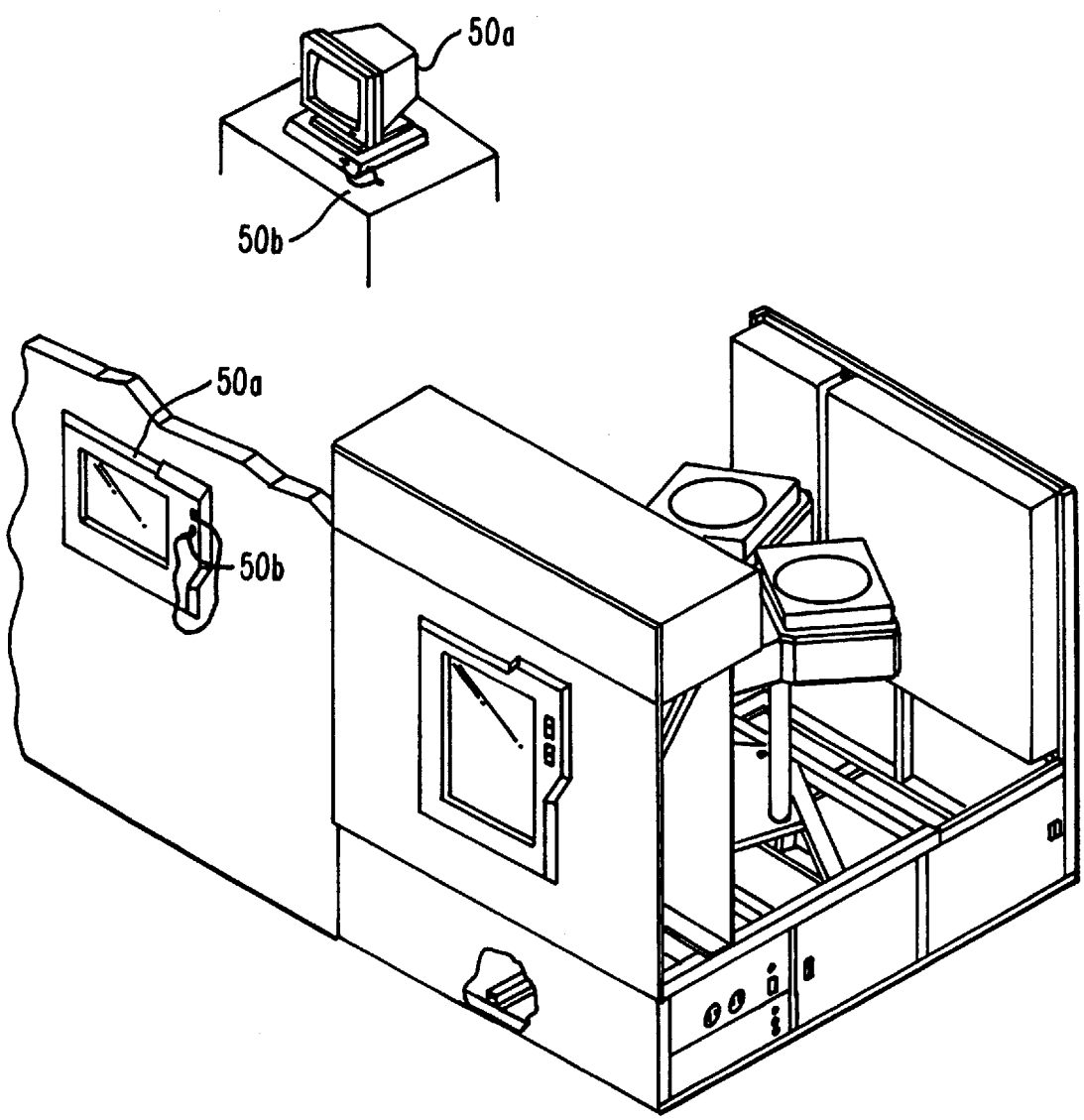
FIG. 1F is a simplified diagram of system monitor and CVD system 10 which may include one or more chambers.

The interface between a user and controller 34 is via a CRT monitor 50a and light pen 50b, shown in FIG. 1F, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. Both monitors 50a simultaneously display the same information, but only one light pen 50b is enabled. The light pen 50b detects light emitted by CRT display with a light sensor in the tip of the pen. To select a particular screen or function, the operator touches a designated area of the display screen and pushes the button on the pen 50b. The touched area changes its highlighted color, or a new menu or screen is displayed, confirming communication between the light pen and the display screen. Of course, other devices, such as a keyboard, mouse, or other pointing or communication device, may be used instead of or in addition to light pen 50b to allow the user to communicate with controller 34.

The processes for depositing and etching the film can be implemented using a computer program product that is executed by controller 34. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows® library routines. To execute the linked, compiled object code, the system user invokes the object code, causing the computer system to load the code in memory, from which the CPU reads and executes the code to perform the tasks identified in the program.

Figure 1G:
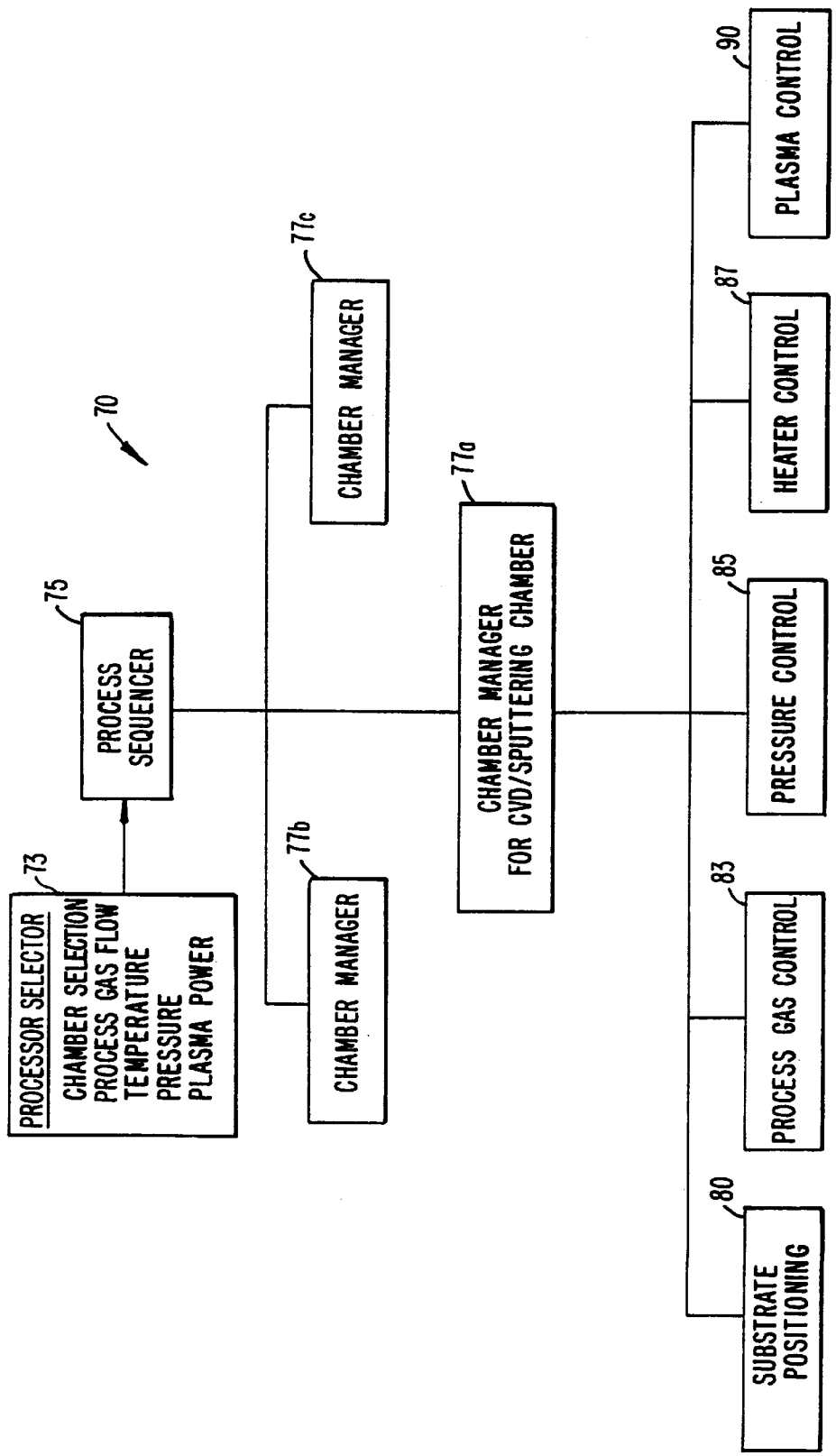
FIG. 1G shows an illustrative block diagram of the hierarchical control structure of the system control software, computer program 70, according to a specific embodiment.

FIG. 1G is an illustrative block diagram of the hierarchical control structure of the system control software, computer program 70, according to a specific embodiment. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. The process selector subroutine 73 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. The parameters are provided to the user in the form of a recipe, and are entered utilizing the light pen/CRT monitor interface.

The signals for monitoring the process are provided by the analog input and digital input boards of the system controller and the signals for controlling the process are output on the analog output and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c, which controls multiple processing tasks in a processing chamber 15 according to the process set determined by the sequencer subroutine 75. For example, the chamber manager subroutine 77a comprises program code for controlling CVD process operations in the processing chamber 15, whereas chamber manages subroutine 77c comprises program code for controlling etchback process operations in etchback chamber 41. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art would readily recognize that other chamber control subroutines can be included depending on what processes are desired to be performed in processing chamber 15 and etchback chamber 41. In operation, the chamber manager subroutine 77a or 77c selectively schedules or calls the process component subroutines in accordance with the particular process set being executed. The chamber manager subroutine 77a or 77c schedules the process component subroutines similarly to how the sequencer subroutine 75 schedules which processing chamber and process set is to be executed next. Typically, the chamber manager subroutine 77a or 77c includes steps of monitoring the various chamber components, determining which components needs to be operated based on the process parameters for the process set to be executed, and causing execution of a chamber component subroutine responsive to the monitoring and determining steps.

Operation of particular chamber component subroutines of chamber manager subroutine 77a will now be described with reference to FIG. 1G. The substrate positioning subroutine 80 comprises program code for controlling chamber components that are used to load the substrate onto the pedestal 12, and optionally to lift the substrate to a desired height in the chamber 15 to control the spacing between the substrate and the gas distribution manifold 11. When a substrate is loaded into the processing chamber 15, the pedestal 12 is lowered to receive the substrate, and thereafter, the pedestal 12 is raised to the desired height in the chamber, to maintain the substrate at a first distance or spacing from the gas distribution manifold during the CVD process. In operation, the substrate positioning subroutine 80 controls movement of the pedestal in response to process set parameters related to the support height that are transferred from the chamber manager subroutine 77a. Substrate positioning routine 80 may also control transfer of a substrate into or out of chamber 15 from, e.g., etchback chamber 41 after the two-step etchback process has been performed.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines, and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as helium or argon is flowed into the chamber 15 to stabilize the pressure in the chamber before reactive process gases are introduced into the chamber. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, TEOS, the process gas control subroutine 83 would be written to include steps for bubbling a delivery gas such as helium through the liquid precursor in a bubbler assembly or introducing a carrier gas such as helium to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system 115 of the chamber. The size of the opening of the throttle valve is set to control the chamber pressure to the desired level in relation to the total process gas flow, size of the process chamber, and pumping set-point pressure for the exhaust system 115. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to the heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in a pedestal 12, compares the measured temperature to the set-point temperature, and increases or decreases current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat the pedestal 12, the heater control subroutine 87 gradually controls a ramp up/down of current applied to the loop. The gradual ramp up/down increases the life and reliability of the lamp. Additionally, a built-in fail-safe mode can be included to detect process safety compliance, and can shut down operation of the heating unit if the process chamber is not properly set up.

The plasma control subroutine 90 comprises program code for setting the low and high frequency RF power levels applied to the process electrodes in the chamber 15, and for setting the low frequency RF frequency employed. If the etchback chamber is used, plasma control subroutine 90 also sets the RF power level for the etchback chamber. Similar to the previously described chamber component subroutines, the plasma control subroutine 90 is invoked by the chamber manager subroutine 77a.

IV. Deposition of FSG Layers Using Chemical and Physical Etchbacks

The present invention provides a two-step etching process that improves the gap-fill of a layer deposited in a substrate processing system such as the exemplary CVD system 10 described above. Current processes used to deposit dielectric layers in such a system may have gap-fill capabilities that are acceptable for many different applications. Some applications, however, (e.g., some applications in which adjacent metal lines have an aspect ratio of 2 or more and spacing between adjacent gates of 0.5 µm or less) require better gap-fill characteristics. In these applications, voids may exist between the metal lines after a dielectric layer is deposited over the lines. These voids may be eliminated using the two-step etching process of the present invention.

In a preferred embodiment of the present invention, a dielectric layer is etched using a two-step etchback sequence that includes a first chemical etchback step, followed by a physical etchback step. Alternatively, the etchback sequence may include a physical etchback step, followed by a chemical etchback step. In yet another preferred embodiment, the etchback sequence may include multiple alternating chemical and physical etchback steps. After completion of the etchback sequence, a second deposition step is employed to complete the gap-fill process.

To illustrate the present invention, this improved etchback sequence is described in detail below in conjunction with the deposition of a triethoxyfluorosilane (TEFS)-based FSG layer. The present invention, however, is not limited to etching back such a layer, and may be used in conjunction with the deposition of other FSG layers and other dielectric layers.

Figure 2A:
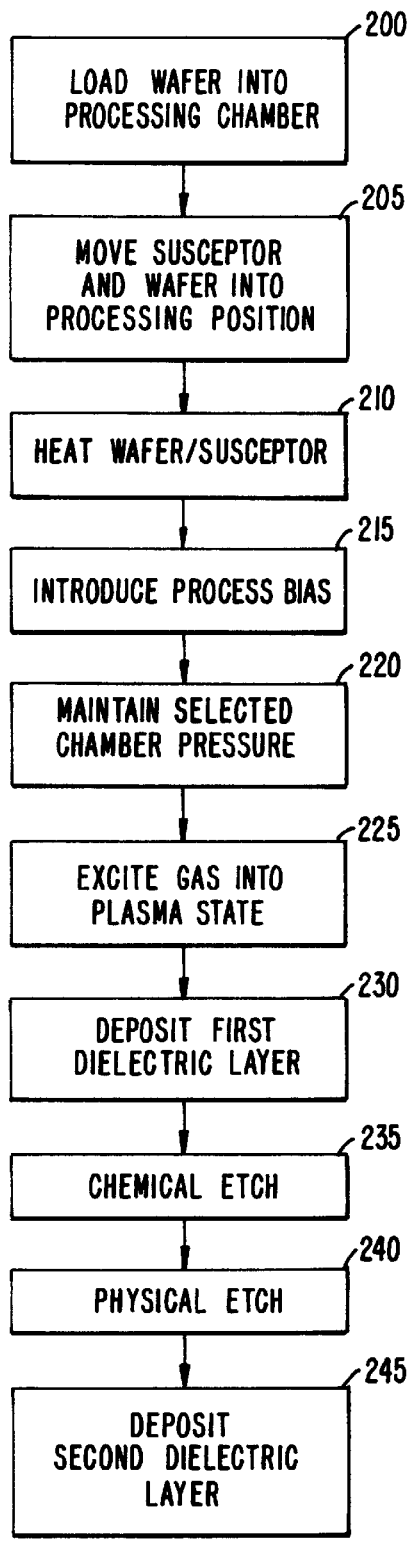
FIG. 2A is a flow chart illustrating process steps in the formation of a TEFS-based FSG thin film according to one preferred embodiment of the method according to the present invention.

To form a stable dielectric layer with good gap-fill capabilities according to the present invention, a wafer is loaded in processing chamber 15 through a vacuumlock door and placed onto pedestal 12 (FIG. 2A, step 200). The pedestal is then moved into processing position 14 (step 205). In processing position 14, the wafer is positioned about 180–280 mil from gas distribution manifold 11. The wafer is preferably positioned about 230 mil from gas distribution manifold 11.

Once the wafer is properly positioned, the wafer and pedestal are heated to a temperature of about 350–500° C. and a process gas is introduced into the processing chamber from the gas distribution manifold (steps 210 and 215). The process gas is preferably a mixture comprising TEFS as the source of fluorine, TEOS as the source of silicon, and one or more gaseous sources of oxygen.

Oxygen in the form of $O_2$ or a similar source is introduced into the chamber preferably at a rate of about 1100–1300 sccm. TEOS, which is in liquid form at room temperature, is vaporized by a liquid injection valve or the like and combined with an inert carrier gas such as helium. The flow rate of TEOS into the injection valve is about 100–1000 mgm, with the preferred range being about 500–600 mgm. TEFS is also in liquid form at room temperature. Its flow rate into the injection valve is about 500–1500 mgm, with the preferred range being about 900–1000 mgm. After being vaporized, the TEOS and TEFS gas sources are mixed with a helium carrier gas introduced at a rate of about 460–660 sccm.

A selected pressure of about 3–7 torr in the system chamber is set and maintained throughout deposition by throttle valve 32 in conjunction with the vacuum pump system and the introduction of the process gas (FIG. 2A, step 220). After processing conditions are set, a plasma is formed (step 225) using a single or mixed-frequency RF power supply. In a preferred embodiment, mixed-frequency RF power is used, and the power supply is driven at a high frequency of 13.56 MHz at about 400–500 W (a power density of about 0.55–0.69 W/cm$^2$), and at a low frequency of about 350 KHz at about 80–180 W (a power density of about 0.11–0.34 W/cm$^2$).

In a preferred embodiment of the method of the present invention, a TEFS-based FSG first layer may be deposited (FIG. 2A, step 230) according to the following process parameters. The wafer is preferably positioned at about 230 mil from the gas distribution manifold. Once the wafer is properly positioned, the wafer and pedestal are heated to a temperature of about 440° C. and the chamber pressure is maintained at about 5 torr. $O_2$ is introduced into the processing chamber from the gas distribution manifold at a rate of about 1180 sccm; TEOS and TEFS are flowed into the injection valve at about 550 mgm and 960 mgm, respectively, and after being vaporized, are mixed with a helium carrier gas introduced at a rate about 560 sccm. After processing conditions are set, a plasma is formed using mixed-frequency RF power supply. The power supply is driven at a high frequency of 13.56 MHz at about 450 W (a power density of about 0.61 W/cm$^2$), and at a low frequency of about 350 KHz at about 130 W (a power density of about 0.17 W/cm$^2$).

In another preferred embodiment of the method of the present invention, a TEFS-based FSG first layer may be deposited according to the above process parameters, but with the following exceptions: the wafer and pedestal are heated to a temperature of about 400° C., TEFS is flowed into the injection valve at about 900 mgm, and the power supply is driven at a low frequency of about 350 KHz at about 200 W (a power density of about 0.27 W/cm$^2$).

Figure 2B:
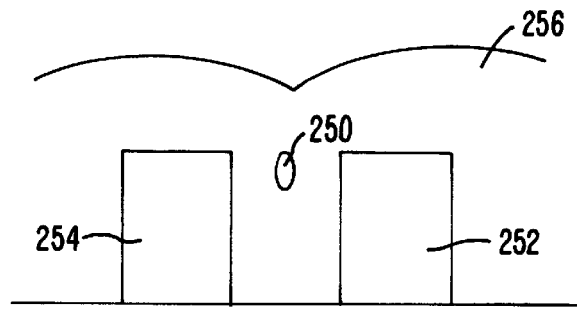
FIG. 2B shows a simplified side cross-sectional view of a void that may exist after a first layer of dielectric material is deposited.

FIG. 2B is a simplified side cross-sectional view of a small void 250 that may exist after the first deposition step (film 256), when, for example, the aspect ratio of metal lines 252 and 254 is 2.0 or greater and the spacing between metal lines 252 and 254 is less than about 0.5 µm. To fill void 250, film 256 is first etched back using the two-step process of the present invention and then a second TEFS layer is deposited over film 256.

In the first step of the etchback process, $CF_4$ or a similar etchant gas is flowed into processing chamber 15, or a separate etchback chamber 41, to chemically etch back (FIG. 2A, step 235) the first TEFS-based FSG layer, thus exposing void 250. As discussed, in a preferred embodiment, the substrate is moved under vacuum seal from the processing chamber to etchback chamber 41 for the chemical and physical etchback processes. Preferably, $CF_4$ is flowed into chamber 41 at a rate of about 5–100 sccm for about 50–150 seconds. Most preferably, $CF_4$ is flowed into the etchback chamber at about 50 sccm for about 86 seconds. The etchback chamber pressure is preferably 50–150 mTorr, the RF power supply is preferably driven at a high frequency of about 13.56 MHz at about 600–750 W (a power density of about 3.29–4.11 W/cm$^2$), and the etch rate is preferably at about 4000–6000 Å/min.

Figure 2C:
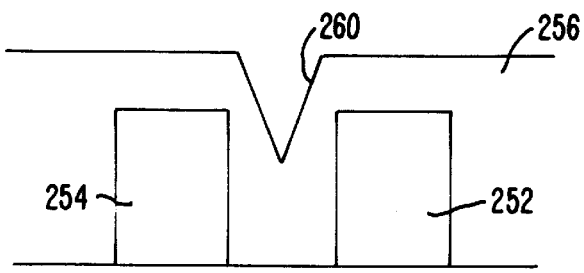
FIG. 2C shows a simplified side cross-sectional view of a first layer of dielectric material after the layer has undergone chemical etchback.

FIG. 2C is a simplified side cross-sectional view of a first layer of dielectric material 256 after layer 256 has undergone chemical etchback. As can be seen from FIG. 2C, the chemical etchback step exposed void 250 in between the metal lines. The boundaries of the exposure 260, however, are sharp and narrow. Hence, completing deposition of the dielectric layer after just the chemical etchback step could be ineffective, as the sharp and narrow exposure 260 is difficult to fill.

Figure 2D:
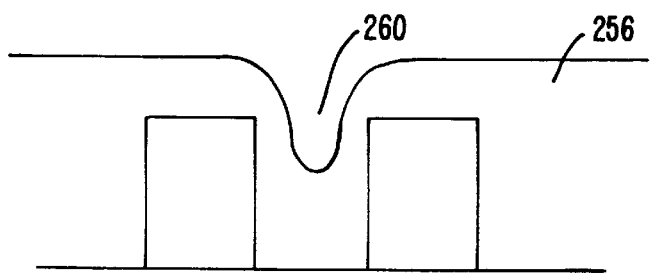
FIG. 2D shows a simplified side cross-sectional view of a first layer of dielectric material after the layer has undergone chemical and physical etchback.

FIG. 2D shows a simplified side cross-sectional view of dielectric layer 256 after layer 256 has undergone chemical and physical etchback steps. Referring to FIG. 2D, it can be seen that a physical etchback step (FIG. 2A, step 240) following the chemical etchback step is advantageous as it widens and smoothes out the sharp and narrow exposure 260 made by the chemical etchback step. Since the boundaries of exposure 260 are widened and smoothed, it is more easily filled by a succeeding deposition step.

A physical etchback step by itself is not as effective as the combined chemical and physical etchback processes of the present invention, since sputtering alone may not reach voids that are below the top of the metal lines. In addition, chemical etchback processes etch the deposited layer away at a faster etch rate than physical etchback processes. Hence, an etchback step that includes both physical and chemical processes is advantageous as it produces exposures with gentle slopes while having an overall faster etch rate. The two-step etchback process, therefore, substantially improves the gap-fill capability of the succeeding deposited layer as compared to conventional one-step etchback methods. In general, a physical etchback process following chemical etchback process is preferred, however, in some cases, the physical etchback process may come before the chemical etchback process.

The physical etchback step may be accomplished through argon sputtering, but other gases may also be used. Argon sputtering may be carried out in the processing chamber 15; as mentioned, it is preferably carried out in etchback chamber 41. Argon may be introduced into the processing chamber or the etchback chamber at a rate of about 5–100 sccm for about 200–350 seconds. Argon is preferably flowed into the etchback chamber at about 50 sccm for about 272 seconds. The pressure within the etchback chamber for the physical etchback process is preferably between 5–50 mTorr, the RF power supply is preferably driven at a high frequency of about 13.56 MHz at about 300–400 W (a power density of about $1.64-2.19$ $W/cm^2$), and the etch rate is preferably at about 150–300 Å/min.

After the physical etchback step is completed, a second dielectric layer may be deposited (FIG. 2A, step 245) to fill the exposures and to planarize the surface. If the etchback steps were carried out in a separate etchback chamber, the substrate is moved, preferably under vacuum seal, from the etchback chamber back to the processing chamber for the final deposition step to take place. This second layer may be an FSG layer, Undoped Silicate Glass (USG) layer, or another dielectric layer. Although other FSG films may be used as the first dielectric layer, as mentioned, TEFS-based FSG films are preferred. This is because films using TEFS as a source of fluorine in general have better gap-fill capability than films using other chemical sources. The method according to the present invention is particularly effective if the first dielectric layer deposited has good gap-fill capability, as the etchbacks have the greatest effect on gap-fill when used on such films. On the other hand, the gap-fill capability of the second dielectric layer is not as critical as the chemical and physical etchbacks ensure that any gaps between the metal lines will be sufficiently filled by the second layer.

The number of chemical and physical processes between the first and concluding deposition steps may differ depending on the location of the void between the metal lines, the spacing between the metal lines, and the aspect ratio of the metal lines. For example, if the void is located far below the upper surface of the metal line, or if the aspect ratio of the metal lines is particularly high, multiple chemical and physical etchback processes may be alternated to better expose the void and further improve the gap-fill capability of the film.

Figure 3A:
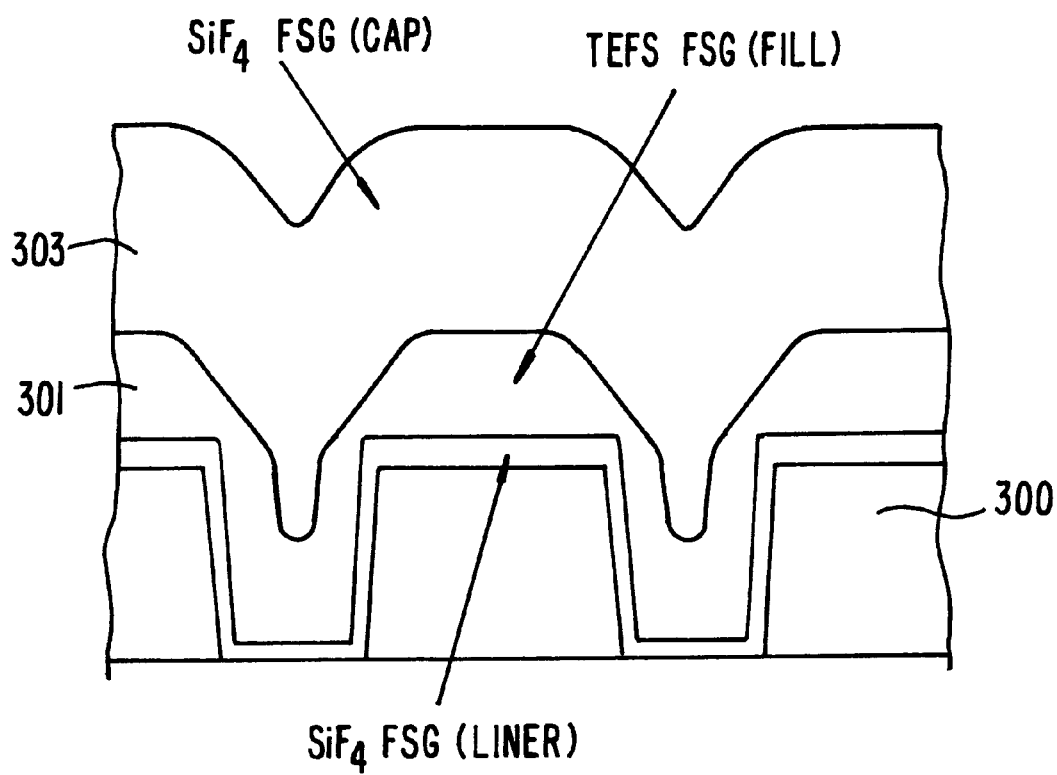
FIG. 3A shows a side cross-sectional view of a film deposited according to the present invention in which a second layer of dielectric material has been deposited over a chemically and physically etched first layer of dielectric material.

FIG. 3A shows a side cross-sectional view of a dielectric film deposited according to the method of the present invention. As can be seen in FIG. 3A, a first dielectric layer 301 deposited is deposited over metal lines 300. Layer 301 was deposited according to the preferred processes described above, and was subsequently chemically and physically etched back as described above. As shown, a second dielectric layer 303 effectively fills the exposures between the metal lines and planarizes the surface.

Figure 3B:
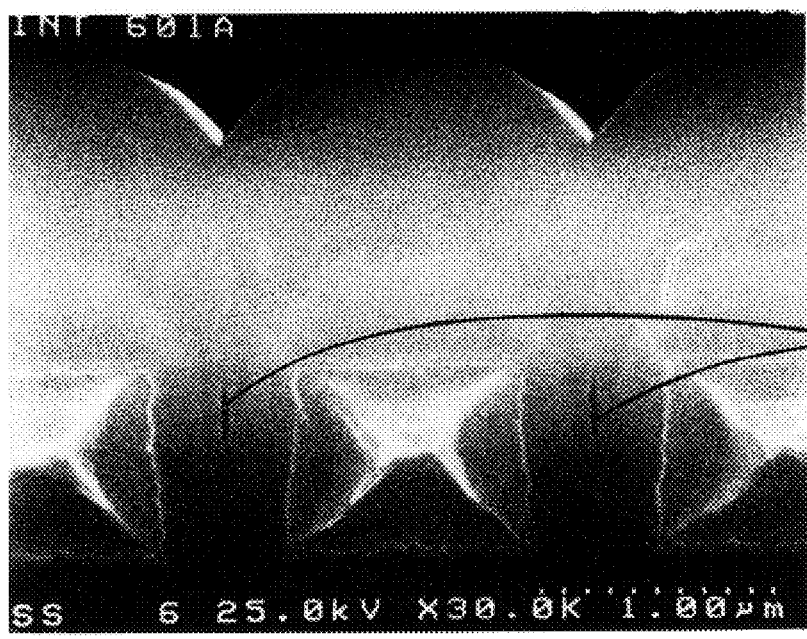
FIG. 3B is a cross-sectional photo micrograph showing the gap-fill capability of an IMD layer deposited according to the method of the present invention.

FIG. 3B is a photo micrograph showing the gap-fill capability of a dielectric layer deposited using a four-step process: a deposition step, followed by an etchback step that includes a chemical etchback process and a physical etchback process, followed by a concluding deposition step. As can be seen, small voids 305 still exist in between the metal lines. This is because the dielectric layer of FIG. 3B was deposited over metal lines with an aspect ratio of 2.0 and a spacing of 0.45 μm. For some applications, voids 305 are sufficiently small such that their existence is acceptable. In such cases, the gap-fill capability of the dielectric layer is sufficient even though the void is not completely filled. On the other hand, some applications require that voids 305 be completely filled in. In such applications, the gap-fill capability of the dielectric layer in FIG. 3B may be further improved by using multiple chemical and physical etchback processes in the etchback step, instead of the single chemical and physical etchback process used in depositing the layer as shown in FIG. 3B. By using multiple chemical and physical etchback processes in the etchback step, a gap-fill capability of less than 0.5 μm with an aspect ratio of 2.0, and possibly up to 3.0 or more can be achieved.

Figure 3C:
FIG. 3C is a cross-sectional photo micrograph showing the gap-fill capability of a passivation layer deposited according to the method of the present invention.

FIG. 3C is also a photo micrograph showing the gap-fill capability of a dielectric layer deposited using the four-step process used to deposit the film shown in FIG. 3B, except the dielectric layers shown in FIG. 3C has a gap width of 0.8 μm with an aspect ratio of 1.6. Referring to FIG. 3C, it can be seen that no voids exist between the metal lines. Hence, multiple chemical and physical etchback processes are not necessary for effective gap fill of the dielectric layers of FIG. 3C, as the gaps between the metal lines are effectively filled with a process that includes a single chemical etchback, and a single physical etchback.

Figure 3D:
FIG. 3D is a cross-sectional photo micrograph showing the gap-fill capability of an IMD layer deposited without the benefit of the present invention.
Figure 3E:
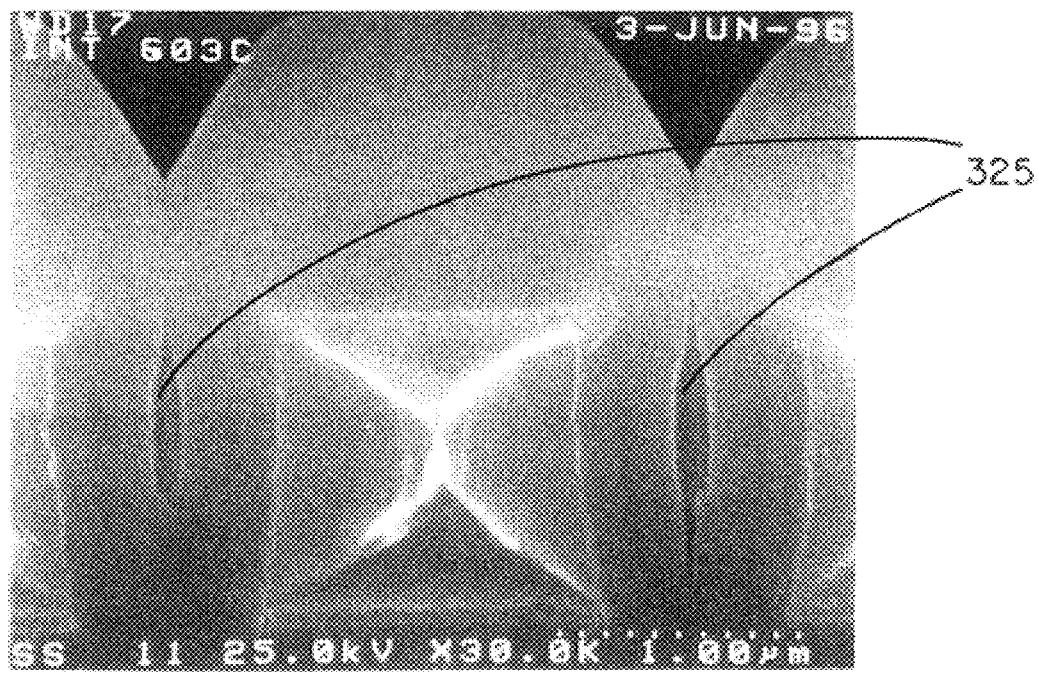
FIG. 3E is a cross-sectional photo micrograph showing the gap-fill capability of a passivation layer deposited without the benefit of the present invention.

FIGS. 3D–E are photo micrographs showing dielectric layers deposited without the benefit of the present invention. The dielectric layers of FIGS. 3D and 3E were deposited and etched back using a single physical etchback step. As can be seen, even though the gap width between the metal lines for FIG. 3B and aspect ratio of the lines are the same as those for FIG. 3D, the dielectric layer in FIG. 3D has larger voids 315 in between the metal lines. In addition, while the dielectric layer deposited according to the method of the invention in FIG. 3C has no voids in between the metal lines, the dielectric layer deposited over metal lines having the same dimensions (gap width of 0.8 μm and aspect ratio of 1.6) without the benefit of the present invention in FIG. 3E has voids 325 between the metal lines. Moreover, voids 325 are rather large.

All the numerical values for the various gas introduction rates for the TEFS film discussed above are based upon a resistively heated D×Z chamber outfitted for 200-mm wafers and manufactured by Applied Materials, while the numerical values for the gas introduction rates for the etchback steps are based upon a Mark II Sputter chamber outfitted for 200-mm wafers and also manufactured by Applied Materials. The use of other volume chambers or chambers made by other manufacturers may result in different gas introduction rates. Hence, the parameters listed in the above process should not be limiting to the claims as described herein. One of ordinary skill in the art can also use other chemicals, chamber parameters, and conditions. As such, the above description is illustrative and not restrictive. Merely by way of example, while the invention is illustrated with particular reference to a process using TEOS as a source of silicon and $O_2$ as a source of oxygen, it is possible to use other silicon sources, such as silane, and other oxygen sources, such as $N_2O$, CO or others. Additionally, while the invention was described with respect to filling gaps between adjacent metal lines, gaps between other protruding structures can also be filled. The scope of the invention should, therefore, be mined not with reference to the above description, but instead should be determined with reference to the appended claims along with their full scope of equivalents.

What is claimed is:

1. A substrate processing system for depositing a layer on a substrate, said system comprising:
   a) a substrate processing chamber in which a dielectric layer is deposited over the substrate and subsequently;
   b) a gas distribution system coupled to said first and second substrate processing chambers and configured to introduce deposition and etching gases to said first and second substrate processing chambers; and
   c) a system controller, coupled to said chamber and said gas distribution system, said system controller having a memory storing a computer-readable program for directing the operation of said system, said computer-readable program comprising;
      a first set of instructions for controlling said gas distribution system to introduce a process gas into said chamber to deposit said dielectric layer over the substrate;
      a second set of instructions for controlling said gas distribution system to introduce an etchant gas into said chamber to chemically etchback said dielectric layer; and
      a third set of instructions for controlling said gas distribution system to introduce a sputtering gas into said second chamber to physically etchback said dielectric layer.

2. The substrate processing system of claim 1 wherein said computer-readable program further includes a fourth set of computer instructions for, after chemically and physically etching back said dielectric layer, controlling said substrate transfer system to transfer said substrate back to said first chamber and controlling said gas delivery system to introduce a second process gas into said first chamber deposit a second dielectric layer over said first dielectric layer.

3. A substrate processing system for depositing a layer on a substrate, said system comprising:
   a) a first substrate processing chamber in which a dielectric layer is deposited over the substrate;
   b) a second substrate processing chamber in which said dielectric layer is etched using both chemical and physical etchback steps;
   c) a gas distribution system coupled to said first and second substrate processing chambers and configured to introduce deposition and etching gases to said first and second substrate processing chambers; and
   d) a system controller, coupled to said first chamber, said second chamber, and said gas distribution system, said system controller having a memory storing a computer-readable program for directing the operation of said system, said computer-readable program comprising;
      a first set of instructions for controlling said gas distribution system to introduce a process gas into said first chamber to deposit said dielectric layer over the substrate;
      a second set of instructions for controlling said gas distribution system to introduce an etchant gas into said second chamber to chemically etchback said dielectric layer; and
      a third set of instructions for controlling said gas distribution system to introduce a sputtering gas into said second chamber to physically etchback said dielectric layer wherein said first and second chambers are different chambers that are part of a multi-chamber processing system, wherein said substrate processing system further comprises a substrate transfer system for transferring the substrate between the first and second chambers, and wherein said computer-readable program further comprises a set of instructions for transferring the substrate from the first chamber to the second chamber after the deposition of the dielectric layer.

4. The substrate processing system of claim 3 wherein said second set of instructions controls said gas delivery system to introduce $CF_4$ at a rate of about 5–100 sccm for about 50–150 seconds into said second chamber to chemically etch back said first dielectric layer.

5. The substrate processing system of claim 3 wherein said third set of instructions controls said gas delivery system to introduce argon at about 5–100 sccm for about 200–350 seconds into said second chamber to physically etch back said first dielectric layer.

6. The substrate processing system of claim 3 wherein said program is configured such that said second set of instructions is executed before said third set of instructions.

7. A computer readable storage medium having program code embodied therein, said program code for controlling a substrate processing system having a first chamber, and a second chamber, said program code controlling the substrate processing system to deposit a layer on a substrate in accordance with the following instructions:
   depositing a first dielectric layer on the substrate in said first chamber;
   etching back said first dielectric layer with both chemical and physical etchback steps in the second chamber.

8. The computer readable storage medium of claim 7 wherein said etching back comprises etching back said first dielectric layer with a chemical etchback step followed by a physical etchback step.

9. The computer readable storage medium of claim 7 wherein said instructions further comprise:
   after said etching back, transferring the substrate from the second chamber back to the first chamber.

10. The computer readable storage medium of claim 9 wherein said instructions further comprise:
    after transferring the substrate back to the first chamber, depositing a second dielectric layer on the substrate.

11. A substrate processing system for depositing a layer on a substrate, said system comprising:
    a) a first substrate processing chamber in which a dielectric layer is deposited over the substrate;
    b) a second substrate processing chamber in which said dielectric layer is etched using both chemical and physical etchback steps;
    c) a gas distribution system coupled to said first and second substrate processing chambers and configured to introduce deposition and etching gases to said first and second substrate processing chambers; and
    d) a system controller, coupled to said first chamber, said second chamber, and said gas distribution system, said system controller having a memory storing a computer-readable program for directing the operation of said system, said computer-readable program controlling the substrate processing system to deposit a layer on a substrate in accordance with the following instructions:
       first, depositing a first dielectric layer on the substrate in said first chamber;
       next, etching back said first dielectric layer with both chemical and physical etchback steps in the second chamber, and
       next, depositing a second dielectric layer on the first layer in the first chamber.

* * * * *